United States Patent [19]

Ito

[11] Patent Number: 5,122,879
[45] Date of Patent: Jun. 16, 1992

[54] TELEVISION SYNCHRONOUS RECEIVER WITH PHASE SHIFTER FOR REDUCING INTERFERENCE FROM A LOWER ADJACENT CHANNEL

[75] Inventor: Katsu Ito, Hoya, Japan
[73] Assignee: Citizen Watch Co., Ltd., Japan
[21] Appl. No.: 531,985
[22] Filed: Jun. 1, 1990
[51] Int. Cl.⁵ .................. H04N 5/50; H04N 5/44
[52] U.S. Cl. .................. 358/195.1; 358/191.1; 358/188; 455/324
[58] Field of Search ............ 358/188, 198, 197, 160, 358/193.1, 195.1, 191.1, 167; 328/155, 133, 138, 55; 333/28 R; 329/358, 360; 455/324

[56] References Cited

U.S. PATENT DOCUMENTS

| | | | |
|---|---|---|---|
| 3,421,121 | 1/1906 | Burnsweig et al. | 333/28 R |
| 3,733,565 | 5/1973 | Pierret | 333/28 R |
| 4,219,812 | 8/1980 | Rittenbach | 343/7.3 |
| 4,578,706 | 3/1986 | Sakamoto | 358/195.1 |
| 4,633,315 | 12/1986 | Kaspekovitz | 358/188 |
| 4,953,182 | 8/1990 | Chung | 375/97 |

OTHER PUBLICATIONS

Sybil P. Parker, *Electronics and Computers*, 2nd ed., McGraw-Hill Book Company, New York, pp. 668–669.

Primary Examiner—James J. Groody
Assistant Examiner—Safet Metjahic
Attorney, Agent, or Firm—Townsend and Townsend

[57] ABSTRACT

A television receiver includes a baseband 90° phase shifter, an adder, and a phase equalizer. The baseband 90° phase shifter obtains in-phase video signals from the video signals of the I and Q signal blocks. The adder voltage-adds the in-phase video signals together. The phase equalizer corrects phase distortion of an output signal from the adder. The 90° phase shifter has an operating frequency band including at least a received channel and a lower adjacent channel. A video signal is extracted from the phase equalizer.

5 Claims, 7 Drawing Sheets

FIG. 9(a)
LOWER-ADJACENT-CHANNEL
SOUND CARRIER INPUT
TO ANALOG SWITCH 516
FIG. 9(b)
OUTPUT FROM
COMPARATOR 514
FIG. 9(c)
OUTPUT FROM
ANALOG SWITCH 516
FIG. 9(d)
OUTPUT FROM
LOW-PASS FILTER 518
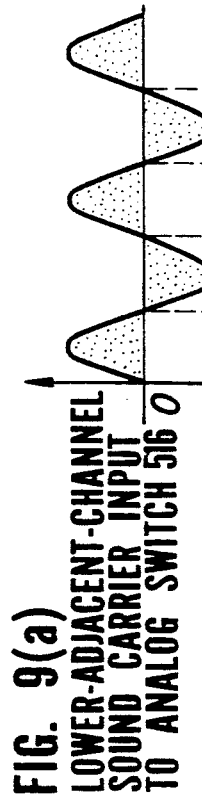
FIG. 9(e)
LOWER-ADJACENT-CHANNEL
SOUND CARRIER INPUT
TO ANALOG SWITCH 524
FIG. 9(f)
OUTPUT FROM
COMPARATOR 522
FIG. 9(g)
OUTPUT FROM
ANALOG SWITCH 524
FIG. 9(h)
OUTPUT FROM
LOW-PASS FILTER 526
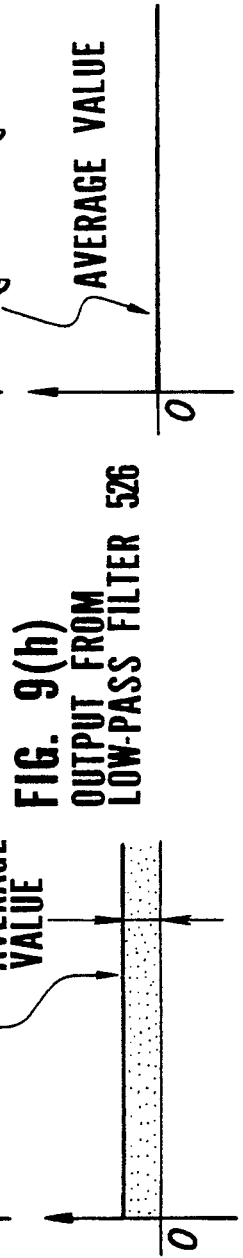

FIG. 10

TELEVISION SYNCHRONOUS RECEIVER WITH PHASE SHIFTER FOR REDUCING INTERFERENCE FROM A LOWER ADJACENT CHANNEL

BACKGROUND OF THE INVENTION

1. Field of the Invention

The present invention relates to a television receiver and, more particularly, to a television receiver of a synchronous carrier reproducing system.

2. Description of the Prior Art

Superheterodyne television tuners have been used for conventional television receivers or as VTR tuners.

FIG. 1 is a block diagram showing a main part of a conventional superheterodyne television receiver. Referring to FIG. 1, reference numeral 102 denotes an RF amplifier; 104, a mixer; 106, an local oscillator; 108, an IF amplifier; 110, a detector; and 112, an output terminal.

An operation of the television receiver having the above-described arrangement will be described below. If the frequency of a desired signal to be applied to the RF amplifier 102 is represented by $f_{RF}$, and the local oscillator 106 frequency is represented by $f_{LO}$, an IF signal having an intermediate frequency $f_{IF} = f_{LO} - f_{RF}$ is obtained from the mixer 104. In this case, an image signal having a frequency $f_{IM} = f_{LO} + f_{IF}$ is rejected by a tuned circuit in the RF amplifier 102. The IF signal is amplified by the IF amplifier 108 and is demodulated by the detector 110. As a result, a baseband video signal is obtained from the output terminal 112.

With such an arrangement, the following advantages can be provided: (1) good frequency selectivity can be obtained; (2) a high gain is ensured prior to the detector without oscillation; and hence (3) the detector can be operated at a relatively high level to obtain good linearity.

In the above-described arrangement, an electronic tuner using a varactor diode is widely used as a tuning element of the RF amplifier 102. In this arrangement, the loss of the tuned circuit in RF amplifier is increased due to a series resistance component of the varactor diode. If required rejection at image frequency is to be obtained, the noise figure is greatly degraded. In order to improve the noise figure, the image rejection must be reduced. This inevitably causes insufficient removal of an image frequency.

In order to prove the above-described problem, a synchronous receiver of a synchronous carrier reproducing system having a phase locked loop known as a Costas loop is applied to a television receiver.

FIG. 2 is a block diagram showing a main part of a conventional television synchronous receiver of a synchronous carrier reproducing system. This receiver comprises: an RF amplifier 202 for amplifying a modulated video carrier wave; a first synchronous detector 204 for detecting an in-phase component of the output from the amplifier 202; a second synchronous detector 206 for synchronously detecting an orthogonal component of the output; low-pass filters 208 and 210 for allowing only baseband signal components of the outputs from the two synchronous detectors to pass therethrough; video signal amplifiers 212 and 214 for amplifying the baseband video signal components; a phase detector 224 for comparing the phases of the outputs from the two signal amplifiers; a low-pass filter 222 for allowing only a low-frequency component of the output from the phase detector 224 to pass therethrough; a voltage adder 220 for adding an output from a channel selection voltage generator 226 for generating a channel selection voltage to the output voltage from the low-pass filter 222; a voltage controlled oscillator 216 to be controlled by the output from the voltage adder 220; a 90° phase shifter 218 for phase-shifting the signal from the voltage controlled oscillator 216 by 90°; and a video signal filter 228. The detected baseband video signal is obtained from an output terminal 230.

In this case, an I signal block 250 is a circuit block, constituted by the synchronous detector 204, the low-pass filter 208, and the video signal amplifier 212, for detecting an in-phase component of a modulated video carrier wave, and a Q signal block 252 is a circuit block, constituted by the synchronous detector 206, the low-pass filter 210, the video signal amplifier 214, and the 90° phase shifter 218, for detecting an orthogonal component of the modulated video carrier wave.

An operation of each signal block will be described below.

A modulated carrier wave of received channel input to the RF amplifier 202 is modulated into a vestigial sideband wave, as shown in FIG. 3. This vestigial sideband wave is divided into three regions, as shown in FIG. 3, and the process of detecting the modulated carrier wave of received channel will be described below, considering the I and Q signal blocks separately.

Referring to FIG. 3, reference numeral 270 denotes an AM (Amplitude Modulation) region; 272, a DSB (Double Sideband) region; and 274, an SSB (Single Sideband) region. Reference symbol Vr denotes a picture carrier; and Ar, a sound carrier.

The I signal block will be described first.

A modulated carrier wave $V_{rAM}(t)$ in the AM region 270 in the received channel is represented as $$V_{rAM}(t) = A(1 + k\cos pt) \cos(\omega_C t - \alpha) \quad (1)$$

where A is the amplitude, k is the modulation factor, cospt is a baseband video signal ($0 \leq p/2\pi \leq 750$ kHz), $\omega_C$ is the angular frequency of a picture carrier, and $\alpha$ is the initial phase of the picture carrier.

An output signal (synchronous carrier) $V_{LOI}(t)$ of the voltage controlled oscillator 216 is represented as $$V_{LOI}(t) = B \cos(\omega_L t - \beta) \quad (2)$$

where B is the amplitude, $\omega_L$ is the angular frequency of an oscillation output signal, and $\beta$ is the initial phase of the oscillation output signal.

When the output signal from the RF amplifier 202 and the output signal from the voltage controlled oscillator 216 are applied to the synchronous detector 204, an output $V_{BAMI}(t)$ from the detector 204 is represented as follows according to equations (1) and (2):

$$\begin{aligned} V_{BAMI}(t) &= V_{rAM}(t) \cdot V_{LOI}(t) \\ &= A(1 + k\cos pt)\cos(\omega_C t - \alpha) \cdot B\cos(\omega_L t - \beta) \\ &= \frac{AB}{2}(1 + k\cos pt)[\cos\{(\omega_C + \omega_L)t - (\alpha + \beta)\} + \cos\{(\omega_C - \omega_L)t - (\alpha - \beta)\}] \end{aligned} \quad (3)$$

The term $\omega_C+\omega_L$ is eliminated by the next low-pass filter 208, and the output from the filter 208 is given by $$V_{BAMI}(t) = \frac{AB}{2}(1 + k\cos pt)\cos\{(\omega_C - \omega_L)t - (\alpha - \beta)\} \quad (4)$$

Since control is performed to establish $\omega_C=\omega_L$ and $\alpha=\beta$ by the Costas loop, i.e., the phase locked loop, constituted by the channel selection voltage generator 226, the I signal block 250, the Q signal block 252, the phase detector 224, the low-pass filter 222, the voltage adder 220, and the voltage controlled oscillator 216, equation (4) can be rewritten as $$V_{BAMI}(t) = \frac{AB}{2}(1 + k\cos pt) \quad (5)$$

In this manner, the baseband signal is demodulated.

A modulated carrier wave in the DSB region 272 in the received channel will be described below. Since the television signal is modulated into the vestigial sideband wave, part of the lower sideband wave of the modulated carrier wave in the DSB region 272 is attenuated. If this attenuation coefficient $\eta$ ($0 \leq \eta \leq 1$) is introduced, a modulated carrier wave $V_{rDSB}(t)$ in the DSB region 272 can be represented as $$V_{rDSB}(t) = \frac{kA}{2}[\eta\cos\{(\omega_C - p)t - \alpha\} + \cos\{(\omega_C + p)t - \alpha\}] \quad (6)$$

where 750 kHz $< p/2\pi \leq$ 1.25 MHz

An output $V_{BDSBI}(t)$ from the synchronous detector 204, therefore, is given by $$\begin{aligned}V_{BDSBI}(t) &= V_{rDSB}(t) \cdot V_{LOI}(t) \quad (7)\\ &= \frac{kA}{2}[\eta\cos\{(\omega_C - p)t - \alpha\} + \cos\{(\omega_C + p)t - \alpha\}] \cdot B\cos(\omega_L t - \beta)\\ &= \frac{kAB\eta}{4}[\cos\{(\omega_C + \omega_L - p)t - (\alpha + \beta)\} + \cos\{(\omega_C - \omega_L - p)t - (\alpha - \beta)\}] +\\ &\quad \frac{kAB}{4}[\cos\{(\omega_C + \omega_L + p)t - (\alpha + \beta)\} + \cos\{(\omega_C - \omega_L + p)t - (\alpha - \beta)\}]\end{aligned}$$

Since the terms $\omega_C+\omega_L-p$ and $\omega_C+\omega_L+p$ are eliminated by the next low-pass filter 208, $$V_{BDSBI}(t) = \frac{kAB\eta}{4}\cos\{(\omega_C - \omega_L - p)t - (\alpha - \beta)\} + \frac{kAB}{4}\cos\{(\omega_C - \omega_L + p)t - (\alpha - \beta)\} \quad (8)$$

Similar to the signal in the AM region, since control is performed by the phase locked loop to establish $\omega_C=\omega_L$ and $\alpha=\beta$ for the signal in the DSB region, equation (8) is rewritten as $$V_{BDSBI}(t) = \frac{kAB}{4}(\eta + 1)\cos pt \quad (9)$$

In this manner, a demodulated signal is obtained.

A modulated carrier wave in the SSB region 274 of the received channel will be described below. A modulated carrier wave $V_{rSSB}(t)$ in the SSB region 274 is represented as $$V_{rSSB}(t) = \frac{kA}{2}\cos\{(\omega_C + p)t - \alpha\} \quad (10)$$

for 1.25 MHz $< p/2\pi <$ 4.5 MHz.

An output $V_{BSSBI}(t)$ from the synchronous detector 204 is given by $$\begin{aligned}V_{BSSBI}(t) &= V_{rSSB}(t) \cdot V_{LOI}(t) \quad (11)\\ &= \frac{kA}{2}\cos\{(\omega_C + p)t - \alpha\}B\cos(\omega_L t - \beta)\\ &= \frac{kAB}{4}[\cos\{(\omega_C + \omega_L + p)t - (\alpha + \beta)\} +\\ &\quad \cos\{(\omega_C - \omega_L + p)t - (\alpha - \beta)\}]\end{aligned}$$

Since the term $\omega_C+\omega_L+p$ is eliminated by the next low-pass filter 208, an output from the filter 208 is given by $$V_{BSSBI}(t) = \frac{kAB}{4}\cos\{(\omega_C - \omega_L + p)t - (\alpha - \beta)\} \quad (12)$$

Similar to the signal in the AM and DSB regions, since control is performed by the phase locked loop to establish $\omega_C=\omega_L$ and $\alpha=\beta$ for the signal in the DSB region, equation (12) is rewritten as $$V_{BSSBI}(t) = \frac{kAB}{4}\cos pt \quad (13)$$

In this manner, a demodulated signal is obtained.

As a result, a baseband video signal cos pt is demodulated in the I signal block according to equations (5), (9), and (13).

A detection process in the Q signal block will be described below in the same manner as in the I signal block.

Since an output signal from the voltage controlled oscillator 216 is phase-shifted by the 90° phase shifter 218, an output $V_{LOQ}(t)$ from it can be represented as $$\begin{aligned}V_{LOQ}(t) &= B\cos(\omega_L t - \beta - \pi/2) \quad (14)\\ &= B\sin(\omega_L t - \beta)\end{aligned}$$

Therefore, in the AM region 270 of the received channel, an output $V_{BAMQ}(t)$ from the synchronous detector 206 is represented as follows according to equations (1) and (14):

$$\begin{aligned}V_{BAMQ}(t) &= V_{rAM}(t) \cdot V_{LOQ}(t) \quad (15)\\ &= \frac{AB}{2}(1 + k\cos pt)[\sin\{(\omega_C + \omega_L)t -\\ &\quad (\alpha - \beta)\} - \sin\{(\omega_C - \omega_L)t - (\alpha - \beta)\}]\end{aligned}$$

The term $\omega_C+\omega_L$ is eliminated by the next low-pass filter 210, and an output from the filter 210 is given by $$V_{BAMQ}(t) = -\frac{AB}{2}(1 + k\cos pt)\sin\{(\omega_C - \omega_L)t - (\alpha - \beta)\} \quad (16)$$

Since control is performed by the phase locked loop to establish $\omega_C=\omega_L$ and $\alpha=\beta$, equation (16) is rewritten as $$V_{BAMQ}(t) = 0 \quad (17)$$

A signal in the DSB region 272 is calculated in the same manner as in the I signal block. As a result, an output $V_{BDSBQ}(t)$ from the synchronous detector 206 is represented as follows according to equations (6) and (14):

$$V_{BDSBQ}(t) = V_{rDSB}(t) \cdot V_{LOQ}(t) \quad (18)$$

$$= \frac{kAB\eta}{4} [\sin\{(\omega_C + \omega_L - p)t - (\alpha + \beta)\} -$$

$$\sin\{(\omega_C - \omega_L - p)t - (\alpha - \beta)\}] +$$

$$\frac{kAB}{4} [\sin\{(\omega_C + \omega_L + p)t - (\alpha + \beta)\} -$$

$$\sin\{(\omega_C - \omega_L + p)t - (\alpha - \beta)\}]$$

Since the terms $\omega_C + \omega_L - P$ and $\omega_C + \omega_L + p$ are eliminated by the low-pass filter 210, equation (18) is rewritten as $$V_{BDSBQ}(t) = \frac{kAB\eta}{4} \sin\{(\omega_C - \omega_L - p)t - (\alpha - \beta)\} - \quad (29)$$

$$\frac{kAB}{4} \sin\{(\omega_C - \omega_L + p)t - (\alpha - \beta)\}$$

Similarly, in this case, since control is performed by the phase locked loop to establish $\omega_c = \omega_L$ and $\alpha = \beta$, equation (19) is rewritten as $$V_{BDSBQ}(t) = \frac{kAB}{4} (\eta - 1)\sin pt \quad (20)$$

A signal in the SSB region 274 is calculated by the same process as described above. As a result, an output $V_{BSSBQ}(t)$ from the synchronous detector 206 is given by follows according to equations (10) and (14):

$$V_{BSSBQ}(t) = V_{rSSB}(t) \cdot V_{LOQ}(t) \quad (21)$$

$$= \frac{kAB}{4} [\sin\{(\omega_C + \omega_L + p)t - (\alpha + \beta)\} -$$

$$\sin\{(\omega_C - \omega_L + p)t - (\alpha - \beta)\}]$$

Since the term $\omega_C + \omega_L + p$ is eliminated by the next low-pass filter 210, equation (21) is rewritten as $$V_{BSSBQ}(t) = - \frac{KAB}{4} \sin\{(\omega_C - \omega_L + p)t - (\alpha - \beta)\} \quad (22)$$

Similarly, since control is performed by the phase locked loop to establish $\omega_C = \omega_L$ and $\alpha = \beta$, equation (22) is then rewritten as $$V_{BSSBQ}(t) = - \frac{kAB}{4} \sin pt \quad (23)$$

As a result, the signals in the DSB and SSB regions 272 and 274 in the Q signal block are demodulated according to equations (17), (20), and (23). Since the baseband signal in the AM region 270 becomes 0 and is not present, a complete video signal cannot be obtained.

For this reason, the baseband video signal is extracted from the I signal block and is obtained from the output terminal 230 through the video signal filter 228.

If a television signal is received by the superheterodyne system, since the IF amplifier or the IF filter has characteristics of a Nyquist slope, the total baseband frequency characteristics are compensated to be flat. However, in this synchronous reception system, since such compensation is not performed, the video signal filter 228 substitutes for this compensation.

In the conventional television synchronous receiver described above with reference to FIG. 2, since the picture carrier frequency of the received channel is equal to the oscillation frequency of the voltage controlled oscillator (local oscillator), no image signals in the superheterodyne system are present. Therefore, the RF amplifier requires no tuned circuit, and the problem which is posed when a varactor diode is used as a tuning element is not present.

In addition, good frequency selectivity can be obtained by the low-pass filters. Furthermore, since a Costas loop as a synchronous carrier reproducing system is applied to the receiver, an input signal having a very low level can be directly demodulated.

In the arrangement shown in FIG. 2, however, if a television signal is present in the lower adjacent channel due to a special condition and place, the signal is folded on a received channel baseband signal, and interference shown in FIG. 4 is caused.

More specifically, in FIG. 4, reference symbol Vr denotes a received channel picture carrier; Ar, a received channel sound carrier; $V_{-1}$, a lower-adjacent-channel picture carrier; and $A_{-1}$, a lower-adjacent-channel sound carrier. When the lower-adjacent-channel sound carrier is converted into a baseband signal, it is folded and superposed on the 1.5 MHz signal in the received channel. As a result, fine beat stripes appear on the screen, and the picture quality is greatly degraded.

According to experiments conducted by the present inventor, it is found that if the level of a sound carrier in a lower adjacent channel carrier is lower than that of a picture carrier in a received channel in an excellent reception state by about 40 dB, no problems are posed in terms of picture quality.

In the conventional television synchronous receiver, interference from a lower adjacent channel cannot be rejected as long as a lower-adjacent-channel signal is not suppressed to be decreased in level by 40 dB or more in the RF amplifier. In practice, however, it is very difficult to selectively suppress a lower-adjacent-channel signal to decrease its level by 40 dB or more by using the tuned circuit in the RF amplifier.

That is, increasing the Q value and greatly narrowing a received channel band by arranging a tuned circuit in the RF amplifier will greatly degrade the noise figure and adversely affect the amplitude and phase characteristics.

SUMMARY OF THE INVENTION

It is an object of the present invention to eliminate such drawbacks of the conventional television synchronous receiver and to provide a television synchronous receiver which can cancel and suppress interference from a lower adjacent channel.

In order to achieve the above object, according to the present invention, the television synchronous receiver having the phase locked loop shown in FIG. 2 comprises a baseband 90° phase shifter for obtaining in-phase video signals from the video signals of the I and Q signal blocks, an adder for voltage-adding the in-phase video signals together, and a phase equalizer for correcting phase distortion of an output signal from the adder, the 90° phase shifter as a constituting element of the Q signal block having an operating frequency band including at least a received channel and a lower adjacent channel, and a video signal being extracted from the phase equalizer. With this arrangement, a television synchronous receiver which is free from interference from a lower adjacent channel can be realized.

In addition, in order to completely cancel the interference from the lower adjacent channel, the above-described television synchronous receiver of the present invention comprises means for detecting amplitude and phase differences between lower-adjacent-channel sound carriers included in video signals output from the I and Q signal blocks, and controlling the amplitude and phase differences to be minimum.

BRIEF DESCRIPTION OF THE DRAWINGS

FIGS. 9(a) to 9(d) and 9(e) to 9(h) are graphs for explaining operations of the respective components of a DAGC block and of a DAPC block, respectively; and FIG. 10 is a circuit diagram showing a variable-phase, wide-band 90° phase shifter.

DETAILED DESCRIPTION OF THE PREFERRED EMBODIMENTS

Embodiments of the present invention will be described below with reference to the accompanying drawings.

Figure 1:
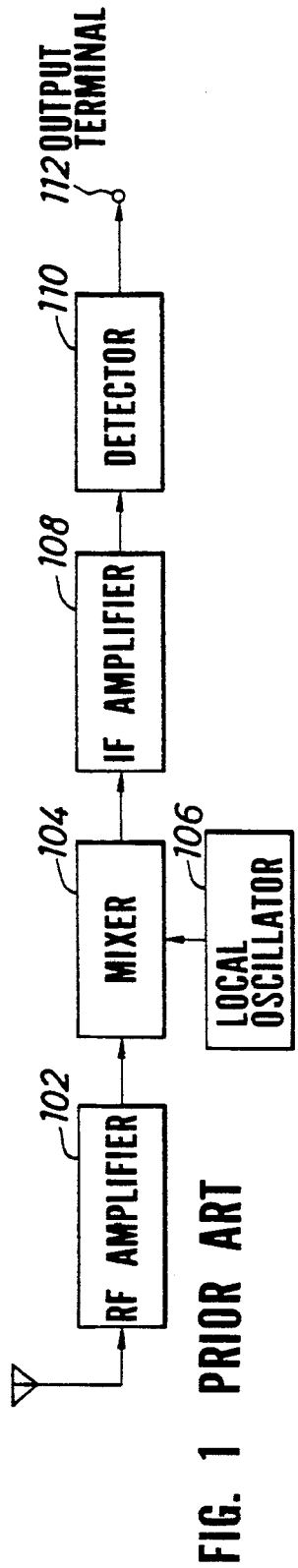
FIG. 1 is a block diagram showing a conventional television receiver of a superheterodyne system.
Figure 2:
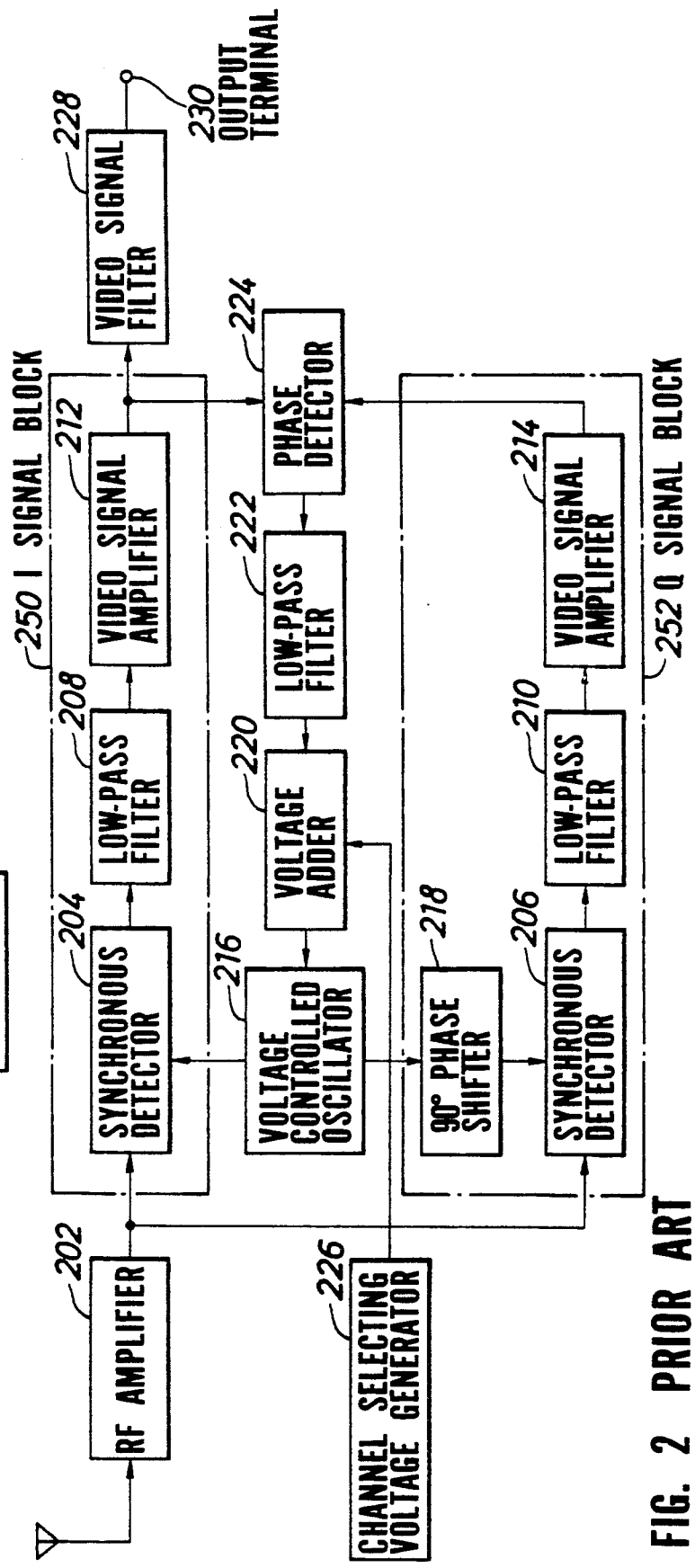
FIG. 2 is a block diagram showing a main part of a conventional television synchronous receiver of a synchronous carrier reproducing system.
Figure 5:
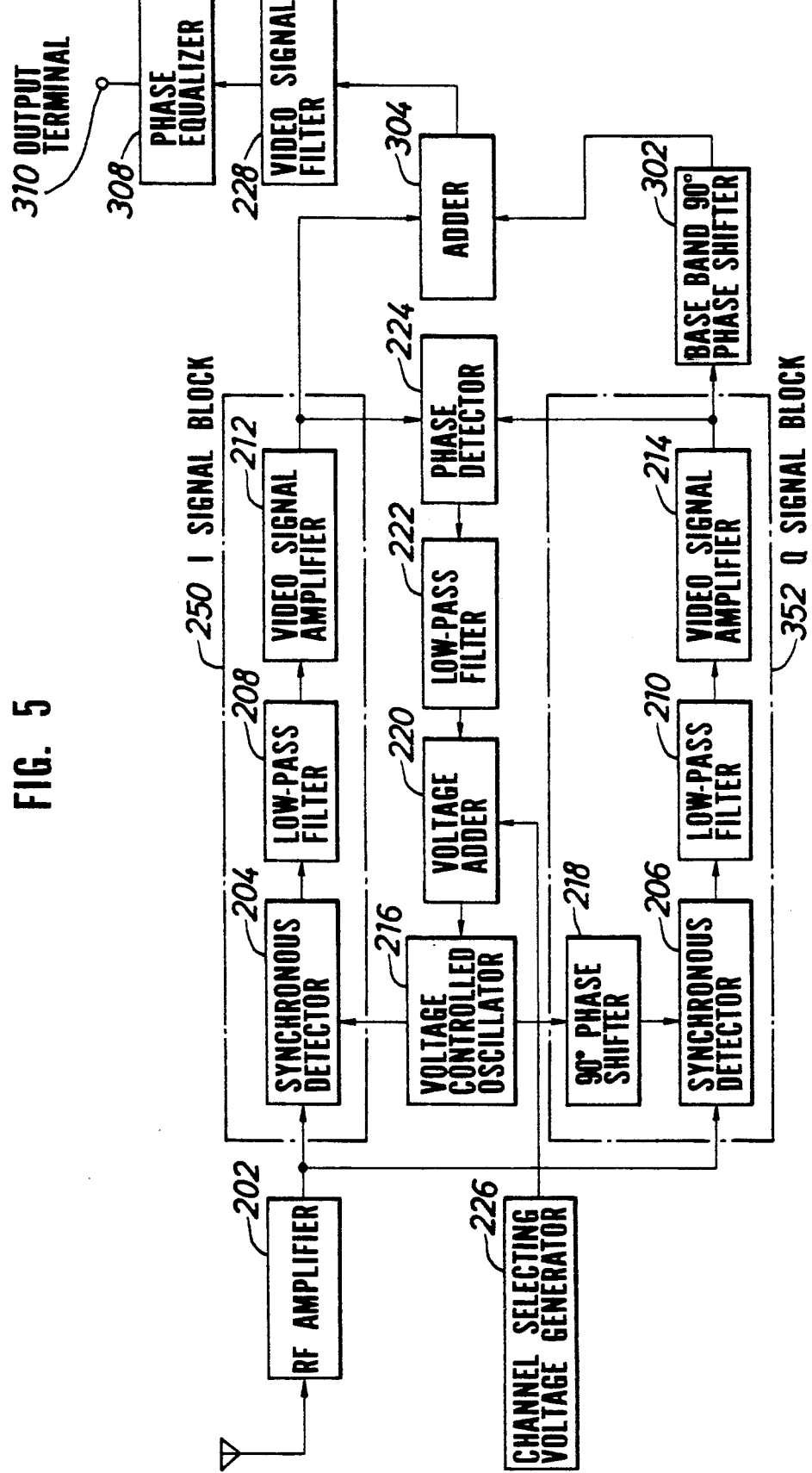
FIG. 5 is a block diagram showing a main part of a television synchronous receiver according to an embodiment of the present invention.

FIG. 5 is a block diagram showing a main part of a television synchronous receiver according to an embodiment of the present invention. The same reference numerals in FIG. 5 denote the same parts as in FIG. 2, and they are identical to each other in terms of contents and operations. Referring to FIG. 5, reference numeral 302 de) notes a baseband 90° phase shifter. In this embodiment, a Q signal block 352 is realized by connecting this baseband 90° phase shifter 302 to the Q signal block 252 in FIG. 2. Outputs from an I signal block and the Q signal block are added together by an adder 304. The output from the adder 304 is then output to an output terminal 310 through a video signal filter 228 and a phase equalizer 308. This operation will be described in detail below.

Assume that a television signal is present in a lower adjacent channel. The signal in the lower adjacent channel which is converted into a baseband signal will be described first.

Figure 3:
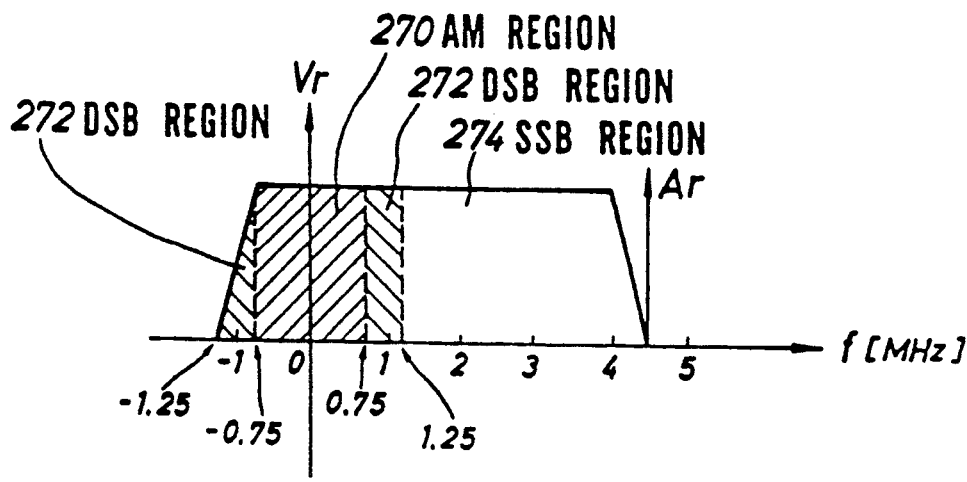
FIG. 3 is a graph showing a residual sideband modulated television signal.
Figure 4:
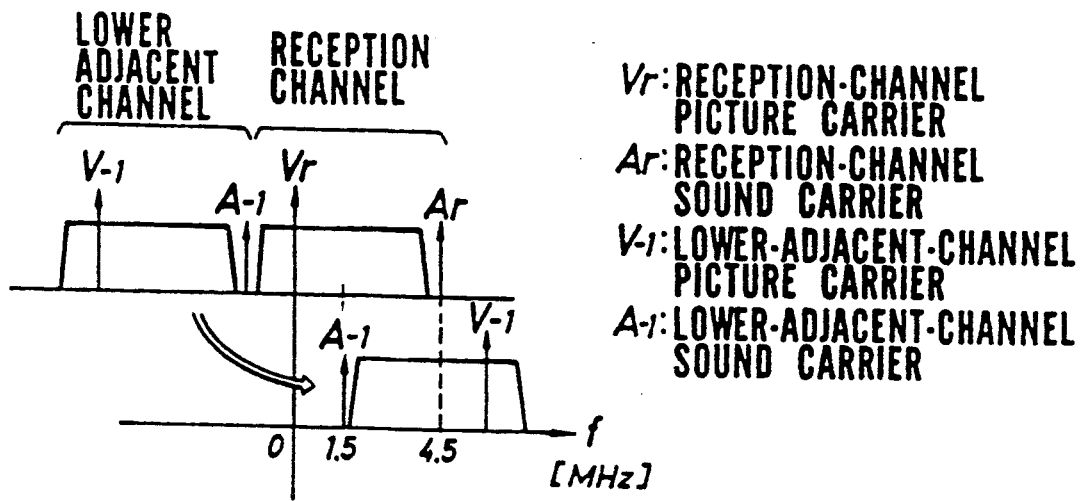
FIG. 4 is a graph showing interference from a lower adjacent channel in a baseband in a conventional television synchronous receiver.

Similar to a received channel modulated picture signal, a modulated carrier wave in the lower adjacent channel can be divided into three regions, i.e., an AM region, a DSB region, and an SSB region, as shown in FIG. 3. A baseband signal output from a low-pass filter 208 of an I signal block 250 is given as follows. Assume that the angular frequency of the picture carrier in the lower adjacent channel is represented by $\omega_{-1}$; and the initial phase, $\gamma$; and that $\omega_{-1}$ and $\gamma$ are respectively substituted for $\omega_c$ and $\alpha$ of equations (4), (8), and (12). In consideration of $\omega_{-1} < \omega_L$, in the AM region, a signal $V_{-1BAMI}(t)$ is given by $$V_{-1BAMI}(t) = \frac{AB}{2} (1 + k\cos pt)\cos\{(\omega_L - \omega_{-1})t + (\gamma - \beta)\} \quad (24)$$

In the DSB region, a signal $V_{-1BDSBI}(t)$ is given by $$V_{-1BDSBI}(t) = \frac{kAB\eta}{4} \cos\{(\omega_L - \omega_{-1} + p)t + (\gamma - \beta)\} + \quad (25)$$
$$\frac{kAB}{4} \cos\{(\omega_L - \omega_{-1} - p)t + (\gamma - \beta)\}$$

In the SSB region, a signal $V_{-1BSSBI}(t)$ is given by $$V_{-1BSSBI}(t) = \frac{kAB}{4} \cos\{(\omega L - \omega_{-1} - p)t + (\gamma - \beta)\} \quad (26)$$

Similarly, according to equations (16), (19), and (22), a baseband signal output from a low-pass filter 214 of the Q signal block 352 is given as follows. In the AM region, a signal $V_{-BAMQ}(t)$ is given by $$V_{-1BAMQ}(t) = \frac{AB}{2} (1 + k\cos pt)\cos\{(\omega_L - \omega_{-1})t + (\gamma - \beta)\} \quad (27)$$

In the DSB region, a signal $V_{-1BDSBQ}(t)$ is given by $$V_{-1BDSBQ}(t) = \frac{kAB\eta}{4} \sin\{(\omega_L - \omega_{-1} + p)t + (\gamma - \beta)\} + \quad (28)$$
$$\frac{kAB}{4} \sin\{(\omega_L - \omega_{-1} - p)t + (\gamma - \beta)\}$$

In the SSB region, a signal $V_{-1BSSBQ}(t)$ is given by $$V_{-1BSSBQ}(t) = \frac{kAB}{2} \sin\{(\omega_L - \omega_{-1} - p)t + (\gamma - \beta)\} \quad (29)$$

Operations of the baseband 90° phase shifter 302 and the adder 304 will be described below.

The baseband signals in the received channel and the lower adjacent channel of the Q signal block 352 are phase-shifted by the phase shifter 302 by 90°. The phase-shifted baseband signal in the received channel of the Q signal block is given as follows according to equations (17), (20), and (23). In the AM region, a signal $V_{BAMQ'}(t)$ is given by $$V_{BAMQ'}(t) = 0 \quad (30)$$

In the DSB region, a signal $V_{BDSBQ'}(t)$ is given by $$V_{BDSBQ'}(t) = \frac{kAB}{4} (\eta - 1)\sin(pt - \pi/2) \quad (31)$$
$$= -\frac{kAB}{4} (\eta - 1)\cos pt$$

In the SSB region, a signal $V_{BSSBQ'}(t)$ is given by $$V_{BSSBQ'}(t) = -\frac{AB}{2} \sin(pt - \pi/2) \tag{32}$$
$$= \frac{kAB}{2} \cos pt$$

The baseband signal in the lower adjacent channel is given as follows according to equations (27), (28), and (29). In the AM region, a signal $V_{-1BAMQ'}(t)$ is given by $$V_{-1BAMQ'}(t) = \frac{AB}{2}(1 + k\cos pt)\sin\{(\omega_L - \omega_{-1})t + (\gamma - \beta) - \pi/2\} \tag{33}$$
$$= -\frac{AB}{2}(1 + k\cos pt)\cos\{(\omega_L - \omega_{-1})t + (\gamma - \beta)\}$$

In the DSB region, a signal $V_{-1BDSBQ'}(t)$ is given by $$V_{-1BDSBQ'}(t) = \frac{kAB\eta}{4} \sin\{(\omega_L - \omega_{-1} + p)t + (\gamma - \beta) - \pi/2\} + \frac{kAB}{4} \sin\{(\omega_L - \omega_{-1} - p)t + (\gamma - \beta) - \pi/2\} \tag{34}$$
$$= -\frac{kAB\eta}{4} \cos\{(\omega_L - \omega_{-1} + P)t + (\gamma - \beta)\}$$
$$- \frac{kAB}{4} \cos\{(\omega_L - \omega_{-1} - P)t + (\gamma - \beta)\}$$

In the SSB region, a signal $V_{-1BSSBQ'}(t)$ is given by $$V_{-1BSSBQ'}(t) = \frac{kAB}{4} \sin\{(\omega_L - \omega_{-1} - p)t + (\gamma - \beta) - \pi/2\} \tag{35}$$
$$= -\frac{kAB}{4} \cos\{(\omega_L - \omega_{-1} - p)t + (\gamma - \beta)\}$$

The baseband signals in the I and Q signal blocks 250 and 352 are added together by the adder 304. The received channel baseband signal output from the adder 304 is given as follows. In the AM region, according to equations (5) and (30), a signal $V_{BAM}(t)$ is given by $$V_{BAM}(t) = V_{BAMI}(t) + V_{BAMQ'}(t) \tag{36}$$
$$= \frac{AB}{2}(1 + k\cos pt)$$

In the DSB region, according to equations (9) and (31), a signal $V_{BDSB}(t)$ is given by $$V_{BDSB}(t) = V_{BDSBI}(t) + V_{BDSBQ'}(t) \tag{37}$$
$$= \frac{kAB}{4}(\eta + 1)\cos pt + \frac{kAB}{4}(\eta - 1)\cos pt$$
$$= \frac{kAB}{2} \cos pt$$

In the SSB region, according to equations (13) and (32), a signal $V_{BSSB}(t)$ is given by $$V_{BSSB}(t) = V_{BSSBI}(t) + V_{BSSBQ'}(t) \tag{38}$$
$$= \frac{kAB}{4} \cos pt - \frac{kAB}{4\cos pt}$$
$$= \frac{kAB}{2} \cos pt$$

In this manner, the baseband is completely demodulated.

The lower-adjacent-channel baseband signal is given as follows. In the AM region, according to equations (24) and (33), a signal $V_{-1BAM}(t)$ is given by $$V_{-1BAM}(t) = V_{-1BAMI}(t) + V_{-1BAMQ'}(t) \tag{39}$$
$$= \frac{AB}{2}(1 + k\cos pt)\cos\{(\omega_L - \omega_{-1})t + (\gamma - \beta)\} -$$
$$\frac{AB}{2}(1 + k\cos pt)\cos\{(\omega_L - \omega_{-1})t + (\gamma - \beta)\}$$
$$= 0$$

In the DSB region, according to equations (25) and (34), a signal $V_{-1BDSB}(t)$ is given by $$V_{-1BDSB}(t) = V_{-1BDSBI}(t) + V_{-1BDSBQ'}(t) \tag{40}$$
$$= \frac{kAB\eta}{4} \cos\{(\omega_L - \omega_{-1} + P)t + (\gamma - \beta)\} +$$
$$\frac{kAB}{4} \cos\{(\omega_L - \omega_{-1} - P)t + (\gamma - \beta)\} -$$
$$\frac{kAB}{4} \eta\cos\{(\omega_L - \omega_{-1} + P)t + (\gamma - \beta)\} -$$
$$\frac{kAB}{4} \cos\{(\omega_L - \omega_{-1} - P)t + (\gamma - \beta)\}$$
$$= 0$$

In the SSB region, according to equations (26) and (35), a signal $V_{-1BSSB}(t)$ is given by $$V_{-1BSSB}(t) = V_{-1BSSBI}(t) + V_{-1BSSBQ'}(t) \tag{41}$$
$$= \frac{kAB}{4} \cos\{(\omega_L - \omega_{-1} - P)t + (\gamma - \beta)\} -$$
$$\frac{kAB}{4} \cos\{(\omega_L - \omega_{-1} - P)t + (\gamma - \beta)\}$$
$$= 0$$

In this manner, the lower-adjacent-channel baseband signal is completely canceled and suppressed.

Figure 6:
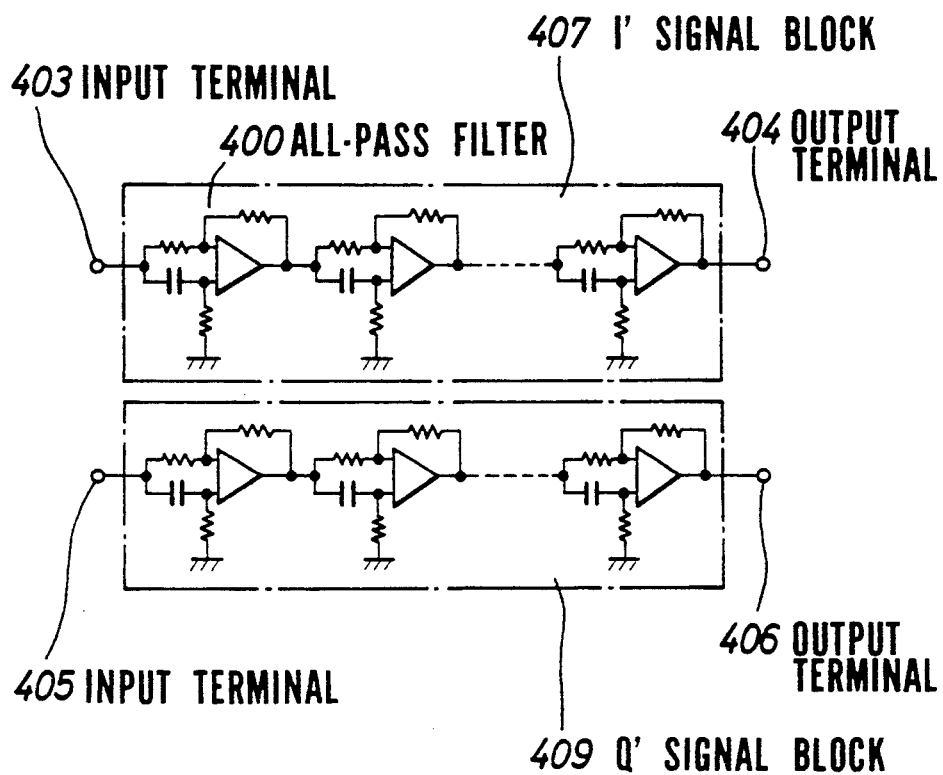
FIG. 6 is a block diagram showing a schematic circuit arrangement of a baseband 90° phase shifter.

FIG. 6 shows an embodiment of the baseband 90° phase shifter 302 used for the television synchronous receiver of the present invention.

This phase shifter comprises an I' signal block 407 constituted by a plurality of series-connected primary all-pass filters 400, and a Q' signal block 409 having the same arrangement, and is designed to obtain a relative phase difference of 90° throughout a wide band. The I' signal block 407 is connected to the output terminal of a video signal amplifier 212 of the I signal block 250 in FIG. 5. Similarly, the Q' signal block 409 is connected to the output terminal of a video signal amplifier 214 of the Q signal block 352 in FIG. 5, thus maintaining a relative phase shift amount of 90° between the blocks within a predetermined band.

In this case, the predetermined bandwidth is ideally set to be DC to 7.25 MHz in consideration of the fact that the baseband signal band of the received channel is DC to 4.5 MHz, and a baseband video signal in the lower adjacent channel is folded to the position of 1.5 MHz to 7.25 MHz. In practice, however, it is very difficult to obtain a 90° phase shifter having such a wide specific band. In consideration of the fact that a signal having a frequency of 4.5 MHz or more is attenuated by the low pass filters 208 and 210, and the lowest frequency of a folded baseband signal of the lower adjacent channel which greatly degrades picture quality is 1.5 MHz, signals in the lower adjacent channel can be satisfactorily canceled by maintaining a phase difference of 90° throughout a band of at least 1.5 MHz to 4.5 MHz. Although no signals having frequencies lower than 750 kHz in the AM region appear at the output of the video signal amplifier 214 of the Q signal block 352 according to equation (17), signals having frequencies of 750 kHz or more appear. In order to completely demodulate a received channel baseband signal, therefore, a 90° phase shifter which operates at least at 750 KHz or more is required.

By adjusting the phase characteristics of the all-pass filters 400 of the baseband 90° phase shifter in FIG. 6, a phase shift of 90°±10° can be realized within an operating bandwidth of 750 kHz to 4.5 MHz. In this case, it is apparent that the video signal filter 228 for flattening a baseband signal can be omitted.

Figure 7:
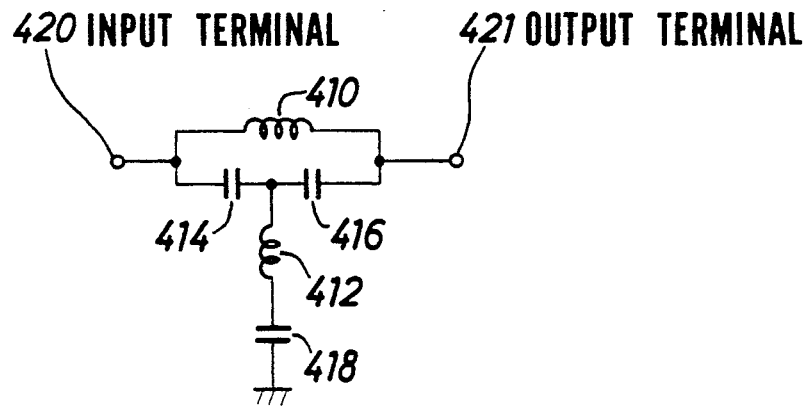
FIG. 7 is a circuit diagram showing a second-order all-pass filter constituting a phase equalizer.

In the baseband 90° phase shifter, phase distortion normally occurs and degrades a signal. However, an output from the phase shifter may be corrected by the phase equalizer 308 to flatten group delay characteristics. FIG. 7 shows an embodiment of the phase equalizer used for the television synchronous receiver of the present invention.

In this phase equalizer, second-order all-pass filters are connected in series in accordance with the degree of phase distortion and the flatness of the group delay characteristics. Referring to FIG. 7, reference numerals 410 and 412 denote coils; and 414, 416, and 418, capacitors.

According to the above-described arrangement, interference from the lower adjacent channel can be canceled, and hence a received channel baseband video signal can be completely demodulated.

In the above-described embodiment, the baseband 90° phase shifter constituted by active elements is exemplified. However, the phase shifter may be constituted by passive elements such as coils and capacitors. In this case, it is clear that the power consumption can be reduced.

Figure 8:
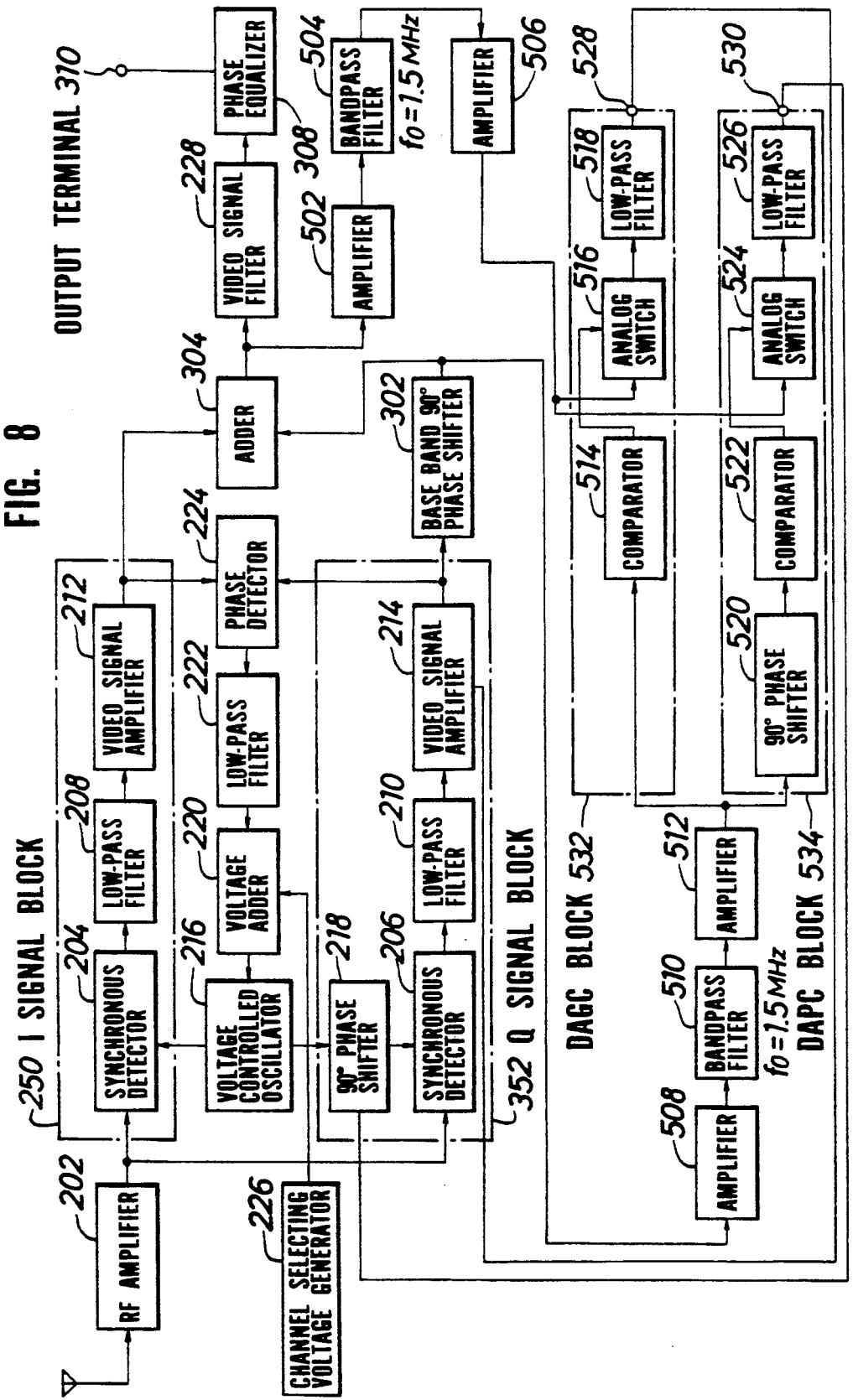
FIG. 8 is a block diagram showing a main part of a television synchronous receiver according to another embodiment of the present invention.

FIG. 8 shows another embodiment comprising means for detecting and minimizing amplitude and phase differences between synchronous detection outputs to be applied to an adder, in order to improve the performance of the television synchronous receiver shown in FIG. 5. This embodiment will be described below with reference to FIG. 8. The same reference numerals in FIG. 8 denote the same parts as in FIG. 5, and they are identical to each other in terms of contents and operations.

Since the operation of a 90° phase shifter 218, a baseband 90° phase shifter 302, or other circuit blocks is not ideal, baseband signals to be applied to an adder 304 from I and Q signal blocks 250 and 352 exhibit unbalanced characteristics between the respective channels, i.e., an amplitude difference or a phase error.

An amplitude difference is based on the fact that coefficients representing the amplitudes of lower-adjacent-channel baseband signals of the I and Q signal blocks, which are given by, e.g., equations (24) and (33), (25) and (34), and (26) and (35), are not equal to each other. With this amplitude difference, even if the baseband signals are added together by the adder 304, a value of 0 is not obtained, unlike in equations (39), (40), and (41). That is, the lower-adjacent-channel baseband signals cannot be satisfactorily canceled and suppressed.

Similarly, a phase error unbalances the amplitudes of lower-adjacent-channel baseband signals of the I and Q signal blocks, i.e., causes an amplitude difference. Therefore, similar to the above-described influence of an amplitude difference, even if the baseband signals are added together by the adder 304, a value of 0 cannot be obtained, unlike in equations (39), (40), and (41). That is, the lower-adjacent-channel baseband signals cannot be satisfactorily canceled and suppressed.

The relationship between a phase error $\phi°$ with respect to 90° and a suppression degree D of the lower adjacent channel can be represented by $$D = 20\log\left(\tan\frac{\phi}{2}\right)[dB] \quad (42)$$

With an error of 1° with respect to 90°, the suppression degree is $-41.2$ [dB]. Therefore, if the phase error of a baseband signal in each of the I and Q signal blocks at the input of the adder 304 is set 1° or less, interference from the lower adjacent channel can be suppressed to such a degree that no problems are posed in terms of picture quality.

According to experiments conducted by the present inventor, the sum of phase errors caused in the 90° phase shifter 218, the baseband 90° phase shifter 302, and other circuit blocks is about 10° at maximum. Such an error can be satisfactorily controlled and corrected by an embodiment of the present invention to be described below. That is, lower-adjacent-channel baseband signals can be canceled and suppressed.

This operation will be described in detail below.

Sound carriers in the lower adjacent channel are respectively extracted from a baseband signal obtained by the adder 304 and an output from the baseband 90° phase shifter 302 of the Q signal block 352 by using bandpass filters 504 and 510 each having a center frequency $f_0=1.5$ MHz. Reference numerals 502, 506, 508, and 512 denote amplifiers for amplifying the extracted lower-adjacent-channel sound carriers to a predetermined value. These amplifiers also perform impedance matching of the bandpass filters 504 and 510.

Each of the two extracted lower-adjacent-channel sound carriers is applied to a DAGC block 532 and a DAPC block 534. The DAGC block 532 is constituted by a comparator 514, an analog switch 516, and a low-pass filter 518. The DAPC block 534 is constituted by a 90° phase shifter 520, a comparator 522, an analog switch 524, and a low-pass filter 526.

More specifically, the lower-adjacent-channel sound carrier output from the adder 304 and amplified by the amplifier 506 is applied to the analog switches 516 and 524 of the DAGC and DAPC blocks 532 and 534. Lower-adjacent-channel sound carrier output from the baseband 90° phase shifter 302 and amplified by the amplifier 512 is applied to the comparator 514 of the DAGC block 532 and to the comparator 522 through the 90° phase shifter 520 of the DAPC block 534.

A control operation of amplitude and phase differences will be described below with reference to graphs in FIGS. 9(a) to 9(h). FIGS. 9(a) to 9(d) are graphs for explaining control of an amplitude difference. FIG. 9(a) shows the waveform of the lower-adjacent-channel sound carrier input to the analog switch 516. The lower-adjacent-channel sound carrier from the amplifier 512 is converted into a square wave by the comparator 514. FIG. 9(b) shows this square waveform. When an output from the comparator 514 is positive, the analog switch 516 is turned on and samples the output from the amplifier 506. FIG. 9(c) shows the lower-adjacent-channel sound carrier sampled by the analog switch 516. The sampled signal is applied to the low-pass filter 518, and a DC control voltage corresponding to the amplitude of this applied sound carrier is obtained from an output terminal 528. FIG. 9(d) shows this DC control voltage, i.e., the waveform of the output from the low-pass filter 518. The DC control voltage output from the output terminal 528 is applied to, e.g., the gain control terminal of a video signal amplifier 214 of the Q signal block 352. Alternatively, the DC control voltage may be applied to a bias terminal provided on a synchronous detector 206. If the amplitude of the output from a video signal amplifier 212 of the I signal block 250 is kept to be a proper value by an ordinary AGC circuit for automatically controlling the gain in accordance with the magnitude of a received carrier signal, only the Q signal block is required to be controlled and corrected by the DAGC block.

FIGS. 9(e) to 9(h) are graphs for explaining control of a phase difference. FIG. 9(e) shows the waveform of the lower-adjacent-channel sound carrier input to the analog switch 524. The lower-adjacent-channel sound carrier input to the DAPC block 534 and amplified by the amplifier 512 is phase-shifted by the 90° phase shifter having a center frequency set at 1.5 MHz. Note that the phase of this 90° phase shifter is strictly adjusted to 90° at the center frequency.

The lower-adjacent-channel sound carrier phase-shifted by the 90° phase shifter 520 by 90° is applied to the comparator 522 and is converted into a square wave. FIG. 9(f) shows the waveform of the output from the comparator 522. In this case, the phase of the carrier is delayed by the 90° phase shifter 520 by 90°. Since this square wave is phase-shifted by 90°, its phase is delayed by 90° with respect to the square wave output from the comparator 514 of the DAGC block 532.

Similar to the case of the DAGC block, when the output from the comparator 522 is positive, the analog switch 524 is turned on and samples the lower-adjacent-channel sound carrier amplified by the amplifier 506. FIG. 9(g) shows the output signal sampled by the analog switch 524.

The sampled signal is applied to the low-pass filter 526. If the phase difference between the lower-adjacent-channel sound carriers in the I and Q signal blocks at the input of the adder 304 is perfectly 0°, the output from the low-pass filter 526 is 0. FIG. 9(h) shows the waveform of the output from the low-pass filter 526 in this case. If the phase difference is not 0°, a DC control voltage corresponding to the phase difference is obtained. The DC control voltage output from an output terminal 530 is applied to the phase control terminal of the phase shifter 218 so as to control the phase difference to be 0.

Figure 10:
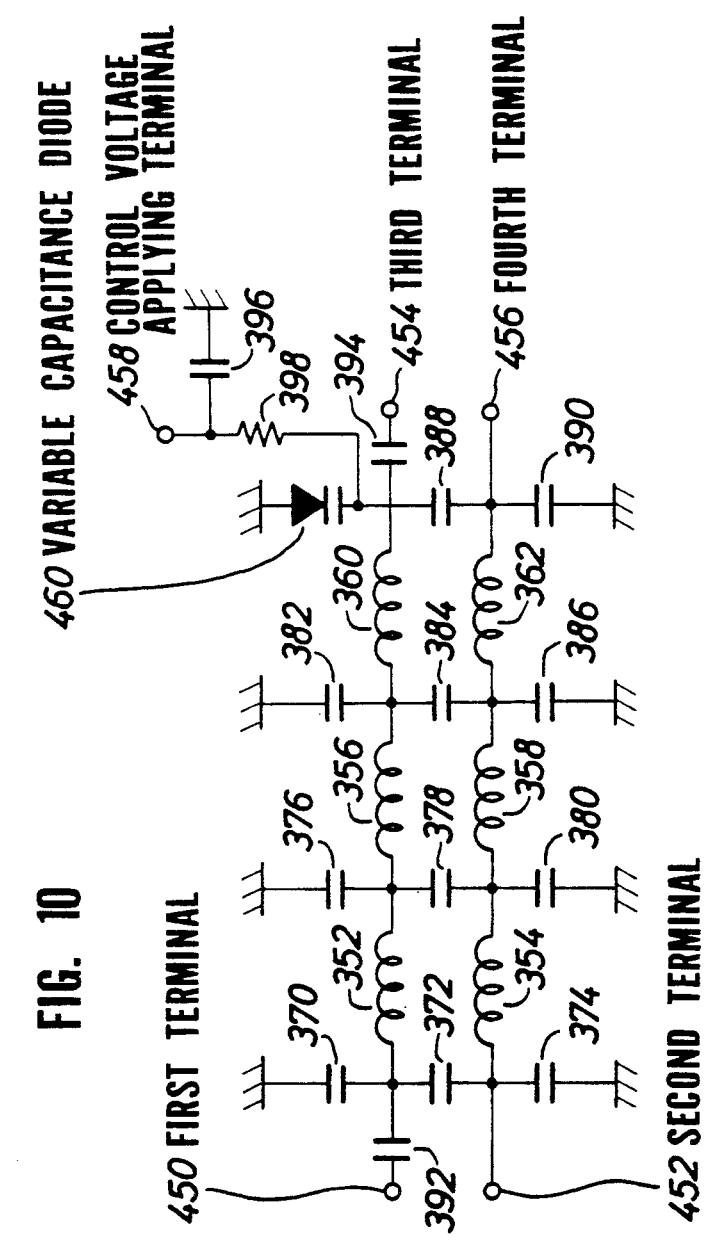

FIG. 10 shows the variable-phase type 90° phase shifter 218. Referring to FIG. 10, reference numerals 370, 372, 374, 376, 378, 380, 382, 384, 386, 388, and 390 denote capacitors; 392 and 394, DC blocking capacitors; 396, a bypass capacitor; 352, 354, 356, 358, 360, and 362, coils; 460, a varactor diode; 398, a resistor for applying a control voltage to the varactor diode 460; 458, a control voltage terminal; 450, a first terminal; 452, a second terminal; 454, a third terminal; and 456, a fourth terminal.

This phase shifter is designed such that a lumped quadrature coupler constituted by the capacitors 370, 372, and 374, the coils 352 and 354, and the capacitors 376, 378, and 380 is cascade-connected through the common input/output capacitors on the adjacent stage and the reactances of the respective coils and capacitors are optimized to realize broad band. In this shifter, the varactor diode is incorporated in the lumped quadrature coupler to control the phase shift amount of the phase shifter by changing the control voltage of the varactor diode.

The phase shifter is operated in the following manner. A load having an impedance $Z_0$ is connected to each of the third and fourth terminals 454 and 456, and the second terminal 452 is grounded through a resistor of $R=Z_0$. When a signal from a signal source having a signal source impedance $Z_0$ is applied to the first terminal 450, the signal is divided into two signals having a phase difference of 90° and are obtained from the third and fourth terminals 454 and 456.

In this embodiment, a lower-adjacent-channel sound carrier is regarded as a detection signal. However, if no lower adjacent channel is present, no operation is performed. If no lower adjacent channel is present, no interference is caused. Even in this case, in order to perform complete demodulation of a received channel video signal, for example, a received channel color carrier located at the position of 3.58 MHz or a received channel audio carrier located at the position of 4.5 MHz may be detected. In this case, it is clear that the center frequency of the bandpass filters 504 and 510 or the 90° phase shifter 520 is changed to the frequency of a detection signal.

As has been described above, according to the present invention, the television receiver includes means for phase-shifting two baseband signals of I and Q signal blocks by 90° to be in phase, and adding the signals together. With this arrangement, interference from a lower adjacent channel can be canceled, and a received channel baseband video signal can be completely demodulated.

What is claimed is:

1. A television receiver including an I signal block for detecting an in-phase component of a modulated carrier wave with a synchronous carrier from a voltage controlled oscillator and outputting a detected first video signal, a Q signal block for outputting a second video signal having a phase difference of 90° relative to the first video signal from said I signal block by detecting an orthogonal component of the modulated carrier wave with a signal obtained by shifting a phase of said synchronous carrier by a 90° phase shifter and outputting the second video signal having a phase difference of 90° relative to the first video signal from said I signal block, and a circuit for detecting a phase error which is a deviation from said 90° phase difference between said first and second video signals from said I and Q signal blocks, and controlling said voltage controlled oscillator so as to minimize the phase error, comprising:

a baseband 90° phase shifter for obtaining in-phase video signals from the first and second video signals of said I and Q signal blocks, said 90° phase shifter having an operating frequency band including at least a received channel and a lower adjacent channel, an adder for voltage-adding the in-phase video signals together, and a phase equalizer for correcting phase distortion of an output signal from said adder, wherein a video signal is extracted from said phase equalizer.

2. A receiver according to claim 1, wherein said baseband 90° phase shifter comprises first-order all-pass filters or circuits including a plurality of said all-pass filters connected in series arranged respectively in said I and Q signal blocks or a circuit including a plurality of said all-pass filters connected in series.

3. A receiver according to claim 1, wherein said phase equalizer comprises second-order all-pass filters or circuits including a plurality of all-pass filters connected in series.

4. A receiver according to claim 1, further comprising means for detecting amplitude difference and phase differences of lower-adjacent-channel sound carriers included in the video signals from said I and Q signal blocks, and controlling the amplitude difference and phase difference to be minimized.

5. A receiver according to claim 1, wherein said 90° phase shifter comprises a variable phase shifter.

* * * * *